United States Patent
Sumita et al.

(10) Patent No.: US 7,169,833 B2
(45) Date of Patent: *Jan. 30, 2007

(54) LIQUID EPOXY RESIN COMPOSITION AND SEMICONDUCTOR DEVICE

(75) Inventors: Kazuaki Sumita, Gunma-ken (JP); Kaoru Katoh, Gunma-ken (JP); Tokue Kojima, Gunma-ken (JP); Toshio Shiobara, Gunma-ken (JP)

(73) Assignee: Shin-Estu Chemical Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/808,329

(22) Filed: Mar. 25, 2004

(65) Prior Publication Data

US 2004/0192810 A1    Sep. 30, 2004

(30) Foreign Application Priority Data

Mar. 28, 2003    (JP)    ............... 2003-089868

(51) Int. Cl.
  *C08K 5/101*    (2006.01)
  *C08K 5/103*    (2006.01)
  *C08L 63/00*    (2006.01)
  *C08L 63/02*    (2006.01)

(52) U.S. Cl. ............ 523/455; 523/445; 523/457; 523/466; 525/476; 525/523

(58) Field of Classification Search ............ None
See application file for complete search history.

(56) References Cited

U.S. PATENT DOCUMENTS 5,371,279 A * 12/1994 Qi et al. ............... 560/263
5,840,417 A * 11/1998 Bolger ............... 428/323

FOREIGN PATENT DOCUMENTS

| JP | 60012318 A | * | 4/1985 |
| JP | 05140267 A | * | 6/1993 |
| JP | 09176294 A | * | 7/1997 |
| JP | 10-158365 A | | 6/1998 |
| JP | 10-158366 A | | 6/1998 |
| JP | 10158366 A | * | 6/1998 |
| JP | 2002121259 A | * | 4/2002 |

OTHER PUBLICATIONS

Translation of Japanese Patent No. 2002-121259, Katsurayama, Apr. 23, 2002, p. 5, paragraph [0017], one page.*

* cited by examiner

*Primary Examiner*—Robert Sellers
(74) *Attorney, Agent, or Firm*—Birch, Stewart, Kolasch & Birch, LLP

(57) ABSTRACT

A liquid epoxy resin composition comprising (A) a liquid epoxy resin, (B) an aromatic amine curing agent comprising 5–100% by weight of a specific aromatic amine compound having a purity of at least 99%, (C) an inorganic filler, and (D) an ester organic solvent having a boiling point of 130–250° C. is useful for semiconductor encapsulation. The composition has an infiltration ability, adhesion to silicon chips, resistance to deterioration under hot humid conditions, and resistance to thermal shocks.

3 Claims, 1 Drawing Sheet

LIQUID EPOXY RESIN COMPOSITION AND SEMICONDUCTOR DEVICE

This Nonprovisional application claims priority under 35 U.S.C. § 119(a) on Patent Application No(s). 2003-089868 filed in JAPAN on Mar. 28, 2003, the entire contents of which are hereby incorporated by reference.

This invention relates to a liquid epoxy resin composition for semiconductor encapsulation, and more particularly, to a liquid epoxy resin composition which has a low viscosity and working efficiency and cures into a product having improved adhesion to the surface of silicon chips and especially photosensitive polyimide resins, nitride films and oxide films, improved resistance to humidity and to thermal shocks at high temperatures above the reflow temperature of 260° C., and is thus suitable as encapsulation material. It also relates to a semiconductor device which is encapsulated with the liquid epoxy resin composition in the cured state.

BACKGROUND OF THE INVENTION

The trend toward smaller sizes, lighter weights and increased capabilities in electrical equipment has brought a shift in the dominant semiconductor mounting process from pin insertion to surface mounting. Progress of semiconductor devices toward a higher degree of integration entails the enlargement of dies to a size as large as 10 mm or more per side. For semiconductor devices using such large size dies, greater stresses are applied to the die and the encapsulant during solder reflow. Such stresses are problematic because separation occurs at the interface between the encapsulant and the die or substrate, and the package cracks upon substrate mounting.

From the expectation that the use of leaded solders will be banned in the near future, a number of lead-substitute solders have been developed. Since most substitute solders have a higher melting temperature than the leaded solders, it has been considered to carry out reflow at temperatures of 260 to 270° C. At higher reflow temperatures, more failures are expected with encapsulants of prior art liquid epoxy resin compositions. Even with flip chip type packages which have raised no substantial problems in the prior art, the reflow at such high temperatures brings about serious problems that cracks can occur during the reflow and the encapsulant can peel at interfaces with chips or substrates. Also undesirably, cracks can occur in the resin, substrate, chip and bumps after several hundreds of thermal cycles.

Also the progress toward higher integration raises a problem of hindered infiltration. In the case of semiconductor using lead wires, as the pitch between leads becomes narrower, the resin is prevented from infiltrating therebetween. In flip-chip semiconductor devices, the infiltration ability is worsened as the pitch between bumps becomes narrower.

SUMMARY OF THE INVENTION

An object of the invention is to provide a liquid epoxy resin composition for semiconductor encapsulation which cures into a cured product that has improved adhesion to the surface of silicon chips and especially photosensitive polyimide resins and nitride films and improved toughness, does not suffer a failure even when the temperature of reflow elevates from the conventional temperature of nearly 240° C. to 260–270° C., does not deteriorate under hot humid conditions as encountered in PCT (120° C./2.1 atm), and does not peel or crack over several hundred cycles of thermal cycling between −65° C. and 150° C. Another object of the invention is to provide a semiconductor device which is encapsulated with a cured product of the liquid epoxy resin composition.

The invention pertains to a liquid epoxy resin composition comprising (A) a liquid epoxy resin, (B) an aromatic amine curing agent, and (C) an inorganic filler. It has been found that better results are obtained when the aromatic amine curing agent (B) contains at least 5% by weight of at least one aromatic amine compound having a purity of at least 99% selected from compounds having the following general formulae (1) to (3):

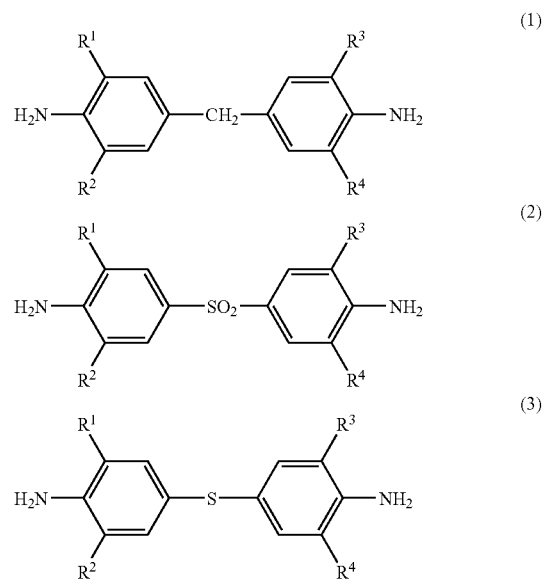

wherein each of $R^1$ to $R^4$ is hydrogen or a monovalent hydrocarbon group having 1 to 6 carbon atoms, and (D) an ester organic solvent having a boiling point of 130 to 250° C. is used in an amount of 0.5 to 10 parts by weight per 100 parts by weight of components (A) and (B) combined. The resulting liquid epoxy resin composition is effectively adherent to the surface of silicon chips and inter alia, photosensitive polyimide resins and nitride films, especially nitride films, does not deteriorate under hot humid conditions as encountered in PCT (120° C./2.1 atm), and is fully resistant to thermal shocks. The composition is thus suited as an encapsulant for large die size semiconductor devices.

Aromatic amine curing agents are per se known for semiconductor encapsulants. In particular, JP-A 10-158365 and JP-A 10-158366 disclose amine curing agents analogous to the aromatic amine curing agents of the formulae (1) to (3) used in the present invention. With respect to the molar ratio of epoxy resin to curing agent, JP-A 10-158366 describes that in a curing agent excess situation that the epoxy resin is not more than 0.9 mole per mole of the curing agent, unreacted amino groups are left in excess, resulting in a lowering of moisture resistance and reliability. The inventors have found that when the epoxy resin and the aromatic amine curing agent of formulae (1) to (3) are used in a molar ratio between 0.7 and 0.9, the liquid epoxy resin composition becomes effectively adherent to the surface of silicon chips and especially photosensitive polyimide resins and nitride films, and significantly resistant to thermal shocks, and maintains satisfactory properties under hot humid conditions.

Moreover, JP-A 10-158366 uses a filler comprising 0% of a fraction having a particle size of 50 microns or greater and up to 30% of a fraction having a particle size of 20 microns or greater. The filler of this size is too large for narrow gap flip-chip semiconductor devices having a gap size of 40 microns or less, probably inviting problems like unfilled defects. On the other hand, well-known fillers for narrow gap flip-chip semiconductor devices cause the composition to have too high a viscosity to infiltrate. Under the circumstances, it has been found that the use of an ester organic solvent having a boiling point of 130 to 250° C. enables to lower the viscosity of the composition, thus improving workability so that no voids are generated during casting and curing steps. As long as the amount of the ester organic solvent is optimized, the composition, despite the use of organic solvent, becomes highly reliable and effective as an encapsulant especially for large die size semiconductor devices.

Therefore, the present invention provides a liquid epoxy resin composition comprising (A) a liquid epoxy resin, (B) an aromatic amine curing agent comprising at least 5% by weight of at least one aromatic amine compound having a purity of at least 99% selected from compounds having the general formulae (1) to (3), (C) an inorganic filler, and (D) an ester organic solvent having a boiling point of 130 to 250° C. in an amount of 0.5 to 10 parts by weight per 100 parts by weight of components (A) and (B) combined.

In a preferred embodiment, the liquid epoxy resin (A) and the aromatic amine curing agent (B) are present in a molar ratio (A)/(B) from 0.7/1 to 0.9/1, and the composition has a toughness $K_{1c}$ of at least 3.5.

The preferred ester organic solvent (D) has the general formula (4):

$$R^5COO—[R^6—O]_n—R^7 \quad (4)$$

wherein $R^5$ and $R^7$ each are a monovalent hydrocarbon group having 1 to 6 carbon atoms, $R^6$ is an alkylene group having 1 to 6 carbon atoms, and n is an integer of 0 to 3.

In a preferred embodiment, the composition further comprises a silicone-modified resin in the form of a copolymer which is obtained from an alkenyl group-containing epoxy resin or phenolic resin and an organopolysiloxane having the average compositional formula (5):

$$H_aR^8_bSiO_{(4-a-b)/2} \quad (5)$$

wherein $R^8$ is a substituted or unsubstituted monovalent hydrocarbon group, "a" is a number of 0.01 to 0.1, "b" is a number of 1.8 to 2.2, and $1.81 \leq a+b \leq 2.3$, said organopolysiloxane containing per molecule 20 to 400 silicon atoms and 1 to 5 hydrogen atoms each directly attached to a silicon atom (i.e., SiH groups), by effecting addition of SiH groups to alkenyl groups.

Also contemplated herein are a semiconductor device which is encapsulated with the liquid epoxy resin composition in the cured state, and a flip chip type semiconductor device which is encapsulated with the liquid epoxy resin composition in the cured state as an underfill.

BRIEF DESCRIPTION OF THE DRAWING

The only FIGURE.

DESCRIPTION OF THE PREFERRED EMBODIMENTS

Figure 1:
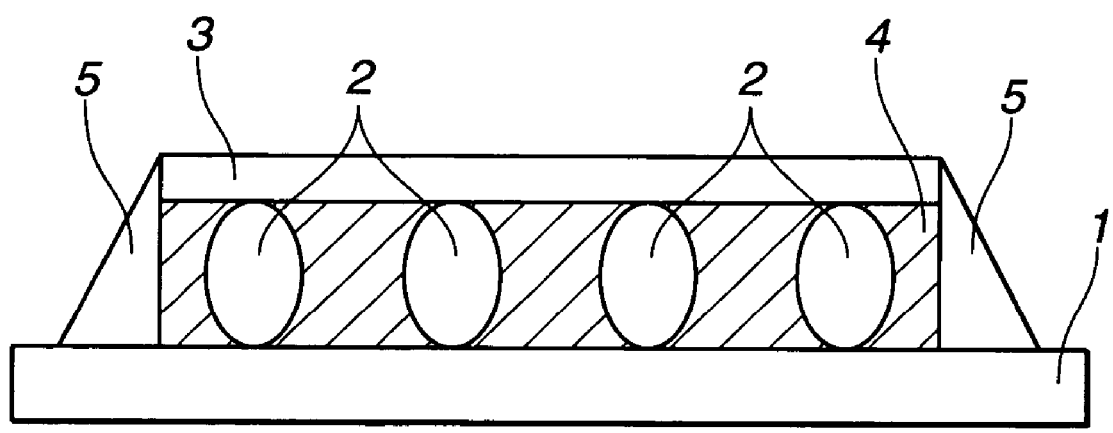
FIG. 1 is a schematic view of a flip chip type semiconductor device according to one embodiment of the invention.

In the liquid epoxy resin composition of the invention serving, any epoxy resin may be used as the liquid epoxy resin (A) as long as it contains three or less epoxy functional groups in a molecule and is liquid at normal temperature. Preferably the liquid epoxy resin has a viscosity at 25° C. of up to 2,000 poises, especially up to 500 poises. Useful liquid epoxy resins include bisphenol type epoxy resins such as bisphenol A epoxy resins and bisphenol F epoxy resins, naphthalene type epoxy resins and phenyl glycidyl ethers. Of these, epoxy resins which are liquid at room temperature are desirable.

The epoxy resin may comprise an epoxy resin of the structure shown below insofar as infiltration ability is not compromised.

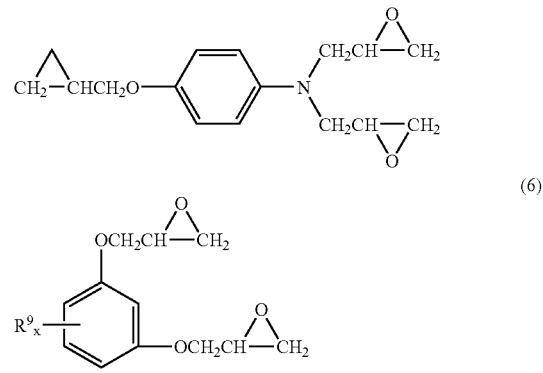

Herein, $R^9$ is hydrogen or a monovalent hydrocarbon group having 1 to 20 carbon atoms, preferably 1 to 10 carbon atoms, more preferably 1 to 3 carbon atoms. Exemplary of the monovalent hydrocarbon group are alkyl groups such as methyl, ethyl and propyl, and alkenyl groups such as vinyl and allyl. The subscript x is an integer of 1 to 4, especially 1 or 2.

It is recommended that the epoxy resin of formula (6), if compounded, be used in an amount of at least 25% by weight, preferably at least 50% by weight, more preferably at least 75% by weight based on the entire epoxy resins. If the content of the epoxy resin of formula (6) is less than 25 wt %, the composition may have an increased viscosity or the heat resistance of cured products may lower. The upper limit may be even 100% by weight.

The epoxy resin of formula (6) is commercially available, for example, under the trade name of RE600NM from Nippon Kayaku Co., Ltd.

The liquid epoxy resin preferably has a total chlorine content of not more than 1,500 ppm, and especially not more than 1,000 ppm. When chlorine is extracted from the epoxy resin with water at an epoxy resin concentration of 50% and a temperature of 100° C. over a period of 20 hours, the water-extracted chlorine content is preferably not more than 10 ppm. A total chlorine content of more than 1,500 ppm or a water-extracted chlorine level of more than 10 ppm may exacerbate the reliability of the encapsulated semiconductor device, particularly in the presence of moisture.

The aromatic amine curing agent (B) used herein contains at least 5% by weight, preferably 10 to 100% by weight, more preferably 20 to 100% by weight, based on the entire curing agent, of at least one aromatic amine compound having a purity of at least 99% selected from compounds having the general formulae (1) to (3). If the content of the aromatic amine compounds having formulae (1) to (3) is less than 5% by weight based on the entire curing agent, adhesive strength lowers and cracks generate. If the purity of the aromatic amine compound is less than 99%, a disgusting odor is given off, exacerbating the working environment. As used herein, the "purity" refers to that of a monomer.

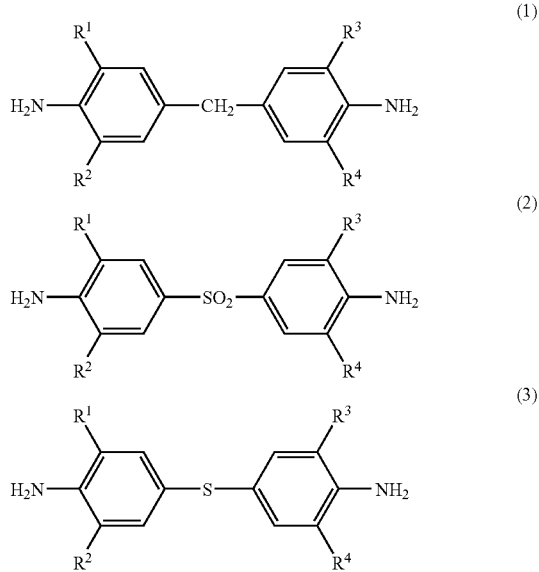

Herein each of $R^1$ to $R^4$ is hydrogen or a monovalent hydrocarbon group having 1 to 6 carbon atoms. The monovalent hydrocarbon groups represented by $R^1$ to $R^4$ are preferably those having 1 to 6 carbon atoms, more preferably 1 to 3 carbon atoms, for example, alkyl groups such as methyl, ethyl, propyl, isopropyl, butyl, isobutyl, tert-butyl and hexyl, alkenyl groups such as vinyl, allyl, propenyl, butenyl and hexenyl, phenyl groups, and halo-substituted monovalent hydrocarbon groups in which some or all of the hydrogen atoms are substituted with halogen atoms (e.g., chlorine, fluorine and bromine), such as fluoromethyl, bromomethyl and trifluoropropyl.

The curing agents other than the above-mentioned aromatic amine compounds are preferably low molecular weight aromatic amines such as 2,4-diaminotoluene, 1,4-diaminobenzene and 1,3-diaminobenzene.

Since the aromatic amine curing agent is generally solid at normal temperature, direct compounding of the aromatic amine curing agent with the epoxy resin results in a resin compound which has an increased viscosity and is awkward to work. It is then preferred to previously melt and mix the aromatic amine curing agent with the epoxy resin, more preferably in a predetermined proportion at a temperature in the range of 70 to 150° C. for 1 to 2 hours. At a mixing temperature below 70° C., the aromatic amine curing agent may be less miscible with the epoxy resin. A temperature above 150° C. can cause the aromatic amine curing agent to react with the epoxy resin to increase its viscosity. A mixing time of less than 1 hour is insufficient to achieve intimate mixing of the aromatic amine curing agent with the resin, inviting a viscosity increase. A time of more than 2 hours may allow the aromatic amine curing agent to react with the epoxy resin to increase its viscosity.

The total amount of the aromatic amine curing agent used herein should preferably be such that the molar ratio of the liquid epoxy resin to the aromatic amine curing agent, (A)/(B), is in the range from 0.7/1 to 0.9/1, more preferably from 0.7/1 to less than 0.9/1, even more preferably from 0.7/1 to 0.85/1. If the compounding molar ratio is less than 0.7, unreacted amine groups are left, probably resulting in a lower glass transition temperature and poor adhesion. With a molar ratio in excess of 0.9, there is a possibility that the toughness $K_{1c}$ value lowers and the cured product becomes hard and brittle enough for cracks to form during the reflow operation or thermal cycling.

As the inorganic filler (C) in the inventive composition, any inorganic filler known to be useful for lowering the expansion coefficient may be added. Specific examples include fused silica, crystalline silica, aluminum, alumina, aluminum nitride, boron nitride, silicon nitride, magnesia and magnesium silicate. Of these, spherical fused silica is desirable for achieving low viscosity. The inorganic filler may have been surface treated with a silane coupling agent or the like although the inorganic filler can be used without surface treatment.

When the liquid epoxy resin composition is used as a potting material, the inorganic filler desirably has an average particle size of 2 to 20 µm and a maximum particle size of preferably up to 75 µm, more preferably up to 50 µm. A filler with an average particle size of less than 2 µm may provide an increased viscosity and cannot be loaded in large amounts. An average particle size of more than 20 µm means the inclusion of a more proportion of coarse particles which will catch on lead wires, causing voids. In this embodiment, the amount of the inorganic filler included in the composition is in a range of preferably 100 to 1,000 parts by weight per 100 parts by weight of the epoxy resin. With less than 100 parts by weight of the filler, the expansion coefficient tends to become too large, which may cause cracks to form in a thermal cycling test. More than 1,000 parts by weight of the filler increases the viscosity, which may bring about a decline in flow.

When the liquid epoxy resin composition is used as an underfill which should exhibit both improved penetration and a lower linear expansion, it is advantageous to include an inorganic filler having an average particle size at most about one-tenth as large and a maximum particle size at most one-half as large as the size of the flip chip gap (between the substrate and semiconductor chip in a flip chip semiconductor device). In this embodiment, the amount of inorganic filler included in the composition is in a range of preferably 50 to 500 parts by weight, and especially 100 to 400 parts by weight, per 100 parts by weight of the epoxy resin. A composition with less than 50 parts by weight of the filler may have too large an expansion coefficient and induce cracks in a thermal cycling test. A composition with more than 500 parts by weight of the filler may have an increased viscosity, which may bring about a decline in thin-film penetration.

In the liquid epoxy resin composition of the invention, (D) an ester organic solvent having a boiling point of 130 to 250° C. is used, especially for the purposes of improving operation efficiency and lowering viscosity. The boiling point of the ester organic solvent is preferably in the range of 140 to 230° C., more preferably 150 to 230° C. An ester organic solvent having a boiling point of lower than 130° C. will volatilize off during dispensing or cure, causing formation of voids. An ester organic solvent having a boiling point of higher than 250° C. will not volatilize off to the last during cure, which can cause. a lowering of strength or adhesion.

Solvents other than the ester organic solvents are undesirable. For example, alcoholic solvents can exacerbate the storage stability of the composition because alcoholic hydroxyl groups readily react with amines. Aromatic solvents have a low boiling point, causing voids. For these reasons and for safety, ester organic solvents having the general formula (4) are preferred.

$$R^5COO\text{---}[R^6\text{---}O]_n\text{---}R^7 \quad (4)$$

Herein $R^5$ and $R^7$ each are a monovalent hydrocarbon group having 1 to 6 carbon atoms, preferably an alkyl group, $R^6$ is an alkylene group having 1 to 6 carbon atoms, and n is an integer of 0 to 3.

Examples of the ester organic solvents having formula (4) include 2-ethoxyethyl acetate, 2-butoxyethyl acetate, diethylene glycol monoethyl ether acetate, and diethylene glycol monobutyl ether acetate.

The ester organic solvent (D) is used in an amount of 0.5 to 10 parts by weight, preferably 1 to 10 parts by weight per 100 parts by weight of the liquid epoxy resin (A) and the curing agent (B) combined. Less than 0.5 pbw of the solvent is insufficient for the viscosity-lowering effect whereas more than 10 pbw of the solvent results in a reduced crosslinking density, failing to provide a sufficient strength.

In the liquid epoxy resin composition of the invention, silicone rubbers, silicone oils, liquid polybutadiene rubbers, and thermoplastic resins such as methyl methacrylate-butadiene-styrene copolymers may be included for the stress reduction purpose. The preferred stress reducing agent is a silicone-modified resin in the form of a copolymer which is obtained from an alkenyl group-containing epoxy resin or alkenyl group-containing phenolic resin and an organopolysiloxane of the average compositional formula (5) containing per molecule 20 to 400 silicon atoms and 1 to 5 hydrogen atoms each directly attached to a silicon atom (i.e., SiH groups), by effecting addition of SiH groups to alkenyl groups.

$$H_aR^8{}_bSiO_{(4-a-b)/2} \quad (5)$$

Herein $R^8$ is a substituted or unsubstituted monovalent hydrocarbon group, "a" is a number of 0.01 to 0.1, "b" is a number of 1.8 to 2.2, and the sum of a+b is from 1.81 to 2.3.

The monovalent hydrocarbon group represented by $R^8$ preferably has 1 to 10 carbons, and especially 1 to 8 carbons. Illustrative examples include alkyl groups such as methyl, ethyl, propyl, isopropyl, butyl, isobutyl, tert-butyl, hexyl, octyl and decyl; alkenyl groups such as vinyl, allyl, propenyl, butenyl and hexenyl; aryl groups such as phenyl, xylyl and tolyl; aralkyl groups such as benzyl, phenylethyl and phenylpropyl; and halogenated monovalent hydrocarbon groups in which some or all of the hydrogen atoms on the hydrocarbon groups have been substituted with halogen atoms (e.g., chlorine, fluorine, bromine), such as fluoromethyl, bromoethyl and trifluoropropyl.

Copolymers having the following structure are preferred.

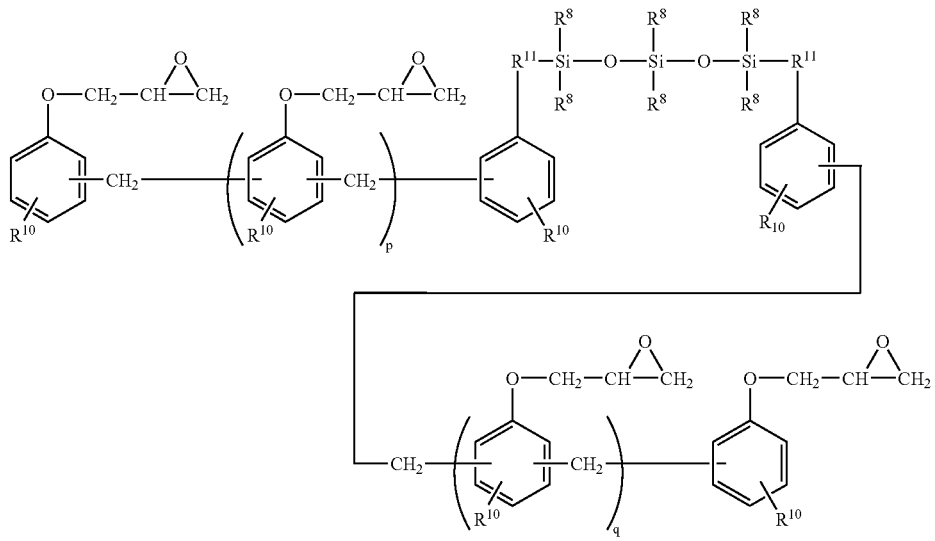

In the above formula, $R^8$ is as defined above, $R^{10}$ is a hydrogen atom or an alkyl of 1 to 4 carbons, and $R^{11}$ is $-CH_2CH_2CH_2-$, $-OCH_2-CH(OH)-CH_2-O-CH_2CH_2CH_2-$ or $-O-CH_2CH_2CH_2-$. The letter m is an integer from 4 to 199, and preferably from 19 to 99, p is an integer from 1 to 10, and q is an integer from 1 to 10.

The above-described copolymer is included in the inventive composition such that the amount of diorganopolysiloxane units is 0 to 20 parts by weight, and preferably 2 to 15 parts by weight, per 100 parts by weight of the epoxy resin, whereby stress can be further reduced.

If necessary, the liquid epoxy resin composition may further contain other additives as long as they do not compromise the objects of the invention. Suitable additives include carbon-functional silanes for improving adhesion, pigments (e.g., carbon black), dyes, and antioxidants. It is recommended that the addition of an alkoxy-bearing silane coupling agent as the carbon functional silane adhesion improver is excluded from the present invention although such a coupling agent can be used as the surface treating agent for the filler.

The liquid epoxy resin composition of the invention may be prepared by the simultaneous or discrete agitation, dissolution, mixing and dispersion of a liquid epoxy resin, an aromatic amine curing agent or a melt mixed masterbatch of liquid epoxy resin and aromatic amine curing agent, an inorganic filler, and an organic solvent as well as optional additives, while carrying out heat treatment if necessary. No particular limitation is imposed on the apparatus used for mixing, agitating, dispersing and otherwise processing the mixture of components. Exemplary apparatus suitable for this purpose include an automated mortar, three-roll mill, ball mill, planetary mixer and bead mill. Use can also be made of suitable combinations of these apparatuses.

For use as a sealant or encapsulant, the liquid epoxy resin composition should desirably have a viscosity of up to 10,000 poises at 25° C., more desirably 10 to 1,000 poises at 25° C.

An ordinary molding method and ordinary molding conditions may be employed when encapsulating semiconductor devices with the inventive composition. It is preferable to carry out an initial hot oven cure at 100 to 120° C. for at least ½ hour, followed by a subsequent hot oven cure at 165° C. for at least 1 hour. A cure time of less than ½ hour during 100 to 120° C. heating may result in void formation after curing. A post-cure time of less than 1 hour during 165° C. heating may yield a cured product having less than sufficient properties.

The liquid epoxy resin composition of the invention should preferably have a toughness $K_{1c}$ of 3.5 to 6.0, more preferably 4.0 to 5.5. A composition with a toughness $K_{1c}$ of less than 3.5 may be weak to thermal shocks and thermal cycling.

The semiconductor devices to be encapsulated with the inventive composition are typically flip chip-type semiconductor devices. Referring to FIG. 1, the flip chip-type semiconductor device includes an organic substrate 1 having an interconnect pattern side on which is mounted a semiconductor chip 3 over a plurality of intervening bumps 2. The gap between the organic substrate 1 and the semiconductor chip 3 (shown in the diagram as gaps between the bumps 2) is filled with an underfill material 4, and the lateral edges of the gap and the periphery of semiconductor chip 3 are sealed with a fillet material 5. The inventive liquid epoxy resin composition is especially suitable in forming the underfill.

When the inventive composition is used as an underfill material, the cured product preferably has a coefficient of thermal expansion of 20 to 40 ppm/° C. below the glass transition temperature (Tg). One effective means of achieving such a coefficient of thermal expansion is by blending 100 to 400 parts by weight of the inorganic filler.

Sealant used as the fillet material may be a conventional material known to the art. The use as the fillet of a liquid epoxy resin composition of the same type as the present invention is especially preferred. The cured product in this case preferably has a coefficient of thermal expansion of 10 to 20 ppm/° C. below the Tg.

EXAMPLE

Examples of the invention and comparative examples are given below by way of illustration, and are not intended to limit the invention.

Examples 1–6 and Comparative Examples 1–4

The components shown in Table 1 were mixed to uniformity on a three-roll mill to give ten resin compositions. These resin compositions were examined by the following tests. The results are also shown in Table 1.

[Viscosity]
The viscosity at 25° C. was measured using a BH-type rotary viscometer at a rotational speed of 4 rpm.

[Penetration test]
A polyimide-coated silicon chip of 10 mm×10 mm was placed on a FR-4 substrate of 30 mm×30 mm using spacers of approximately 50 μm thick, leaving a gap therebetween. The resin composition was melted on a hot plate at 100° C. and allowed to penetrate into the gap. The time taken until the gap was fully filled with the composition was measured.

[Void test]
A polyimide-coated silicon chip of 10 mm×10 mm was placed on a FR-4 substrate of 30 mm×30 mm using spacers of approximately 50 μm thick, to form a flip chip package having a gap of approximately 50 μm. The composition was introduced into the gap and cured thereat. Using a scanning acoustic microscope C-SAM (SONIX Inc.), the sample was inspected for voiding.

[Toughness $K_{1c}$]
The toughness $K_{1c}$ at normal temperature was measured according to ASTM D5045.

[Glass Transition Temperature (Tg)]
Using a sample of the cured composition measuring 5×5×15 mm, the glass transition temperature was measured with a thermomechanical analyzer at a heating rate of 5° C./min.

[Coefficients of Thermal Expansion (CTE)]
Based on the Tg measurement described above, a coefficient of thermal expansion below Tg (CTE-1) was determined for a temperature range of 50 to 80° C., and a coefficient of thermal expansion above Tg (CTE-2) was determined for a temperature range of 200 to 230° C.

[Bond strength test]
On a polyimide-coated silicon chip was rested a frustoconical sample having a top diameter of 2 mm, a bottom diameter of 5 mm and a height of 3 mm. It was cured at 150° C. for 3 hours. At the end of curing, the sample was measured for (initial) shear bond strength. The cured sample was then placed in a pressure cooker test (PCT) environment of 121° C. and 2.1 atm for 336 hours for moisture absorption. At the end of PCT test, shear bond strength was measured again. In each Example, five samples were used, from which an average bond strength value was calculated.

[PCT peel test]
A polyimide-coated 10×10 mm silicon chip was stacked on a 30×30 mm FR-4 substrate using spacers of approximately 100 μm thick, to form a flip chip package having a gap of approximately 100 μm. An epoxy resin composition was introduced into the gap and cured thereat. The assembly was held at 30° C. and RH 65% for 192 hours and then processed 5 times by IR reflow set at a maximum temperature of 265° C., before the assembly was checked for peeling. The assembly was then placed in a PCT environment of 121° C. and 2.1 atm for 336 hours, before the assembly was checked for peeling. Peeling was inspected by C-SAM (SONIX Inc.).

[Thermal shock test]
A polyimide-coated 10×10 mm silicon chip was stacked on a 30×30 mm FR-4 substrate using spacers of approximately 100 μm thick, to form a flip chip package having a gap of approximately 100 μm. An epoxy resin composition was introduced into the gap and cured thereat. The assembly was held at 30° C. and RH 65% for 192 hours and then processed 5 times by IR reflow set at a maximum temperature of 265° C. The assembly was then tested by thermal cycling between −65° C./30 minutes and 150° C./30 minutes. After 250, 500 and 750 cycles, the assembly was examined for peeling and cracks.

TABLE 1

| Component (pbw) | Example 1 | Example 2 | Example 3 | Example 4 | Example 5 | Example 6 | Comparative Example 1 | Comparative Example 2 | Comparative Example 3 | Comparative Example 4 |
|---|---|---|---|---|---|---|---|---|---|---|
| C-100S | 30 | | | | | | 30 | 30 | 30 | 30 |
| C-300S | | 35 | 35 | 35 | 35 | 40 | | | | |
| RE303S-L | 63 | 58 | 58 | 58 | 58 | | 63 | 63 | 63 | 63 |
| RE600NM | | | | | | 53 | | | | |
| Spherical silica | 150 | 150 | 150 | 150 | 150 | 150 | 150 | 150 | 150 | 150 |
| KBM403 | 1 | 1 | 1 | 1 | 1 | 1 | 1 | 1 | 1 | 1 |
| Copolymer | 4 | 4 | 4 | 4 | 4 | 4 | 4 | 4 | 4 | 4 |
| Solvent A | 3 | 6 | | | | 3 | | 20 | | |
| Solvent B | | | 3 | | | | | | | |
| Solvent C | | | | 3 | | | | | | |
| Solvent D | | | | | 3 | | | | | |
| Solvent E | | | | | | | | | 3 | |
| Solvent F | | | | | | | | | | 3 |
| Measurement results | | | | | | | | | | |
| Viscosity (Pa·s @ 25° C.) | 20.5 | 8.8 | 21.1 | 25.8 | 19.9 | 19.8 | 110.9 | 2.2 | 17.1 | 21.1 |
| Viscosity after 40° C./24 hr (Pa·s @ 25° C.) | 55.5 | 20.5 | 52.5 | 62.8 | 87.5 | 88.1 | 322 | 16.8 | 280 | 340 |
| Penetration time (sec) | 25 | 18 | 26 | 31 | 25 | 27 | 205 | 15 | 20 | 24 |
| Void test | nil | nil | nil | nil | nil | nil | voids | nil | voids | voids |
| Toughness $K_{1c}$ | 4.0 | 3.7 | 4.2 | 4.3 | 4.5 | 4.3 | 4.5 | 2.2 | 3.1 | 3.4 |
| Tg (° C.) | 105 | 86 | 100 | 104 | 110 | 109 | 115 | 35 | 60 | 79 |
| CTE-1 (ppm/° C.) | 31 | 30 | 30 | 30 | 32 | 30 | 31 | 35 | 39 | 38 |
| CTE-2 (ppm/° C.) | 120 | 115 | 113 | 115 | 115 | 121 | 113 | 125 | 164 | 144 |
| PCT peel test — After 5 times of IR reflow at 265° C. | no peeling | no peeling | no peeling | no peeling | no peeling | no peeling | no peeling | peeled | peeled | peeled |
| PCT peel test — After PCT 336 hr | no peeling | no peeling | no peeling | no peeling | no peeling | no peeling | no peeling | peeled | peeled | peeled |
| Bond strength (kgf/cm²) — Initial | 186 | 168 | 175 | 183 | 193 | 185 | 195 | 15 | 117 | 125 |
| Bond strength (kgf/cm²) — After PCT 336 hr | 126 | 89 | 103 | 117 | 145 | 133 | 134 | 0 | 55 | 0 |
| Failure (%) after thermal shock test — 250 cycles | 0 | 0 | 0 | 0 | 0 | 0 | 0 | 100 | 50 | 100 |
| Failure (%) after thermal shock test — 500 cycles | 0 | 0 | 0 | 0 | 0 | 0 | 0 | — | 100 | — |
| Failure (%) after thermal shock test — 750 cycles | 0 | 0 | 0 | 0 | 0 | 0 | 0 | — | — | — |

Components:
Solvent A: 2-ethoxyethyl acetate, boiling point 156.3° C.
Solvent B: 2-butoxyethyl acetate, boiling point 192° C.
Solvent C: diethylene glycol monoethyl ether acetate, boiling point 217.4° C.
Solvent D: propylene glycol monomethyl ether acetate (PGMEA), boiling point 146° C.
Solvent E: carbitol, boiling point 202° C.
Solvent F: PGME, boiling point 120° C.
C-100S: diethyldiaminophenylmethane, Nippon Kayaku Co., Ltd.
C-300S: tetraethyldiaminophenylmethane, Nippon Kayaku Co., Ltd.
RE303S-L: bisphenol F-type epoxy resin, Nippon Kayaku Co., Ltd.
RE600NM: Nippon Kayaku Co., Ltd.

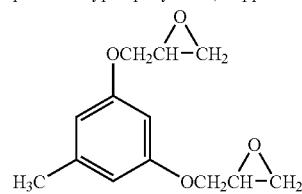

KBM403: silane coupling agent, γ-glycidoxypropyltrimethoxy-silane, Shin-Etsu Chemical Co., Ltd.
Spherical silica: spherical silica having a maximum particle size of up to 24 μm and an average particle size of 6 μm
Copolymer: the addition reaction product of

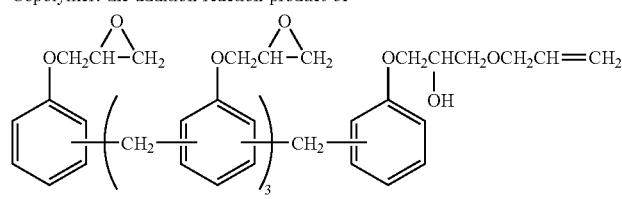

TABLE 1-continued

| Component | Example | | | | | | Comparative Example | | | |
|---|---|---|---|---|---|---|---|---|---|---|
| (pbw) | 1 | 2 | 3 | 4 | 5 | 6 | 1 | 2 | 3 | 4 | and

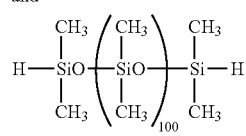

It has been demonstrated that the liquid epoxy resin composition of the invention cures into a cured product which has improved adhesion to the surface of silicon chips and especially to photosensitive polyimide resins and nitride films, and offers an encapsulated semiconductor device that does not suffer a failure even when the temperature of reflow after moisture absorption elevates from the conventional temperature of nearly 240° C. to 260–270° C., does not deteriorate under hot humid conditions as encountered in PCT (120° C./2.1 atm), and does not undergo peeling or cracking over several hundred cycles of thermal cycling between −65° C. and 150° C. The composition is thus best suited as an encapsulant for semiconductor devices.

Japanese Patent Application No. 2003-089868 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A liquid epoxy resin composition comprising
(A) 100 parts by weight of a liquid epoxy resin,
(B) an aromatic amine curing agent comprising at least 5% by weight of at least one aromatic amine compound having a purity of at least 99% selected from compounds having the following general formulae (1) to (3):

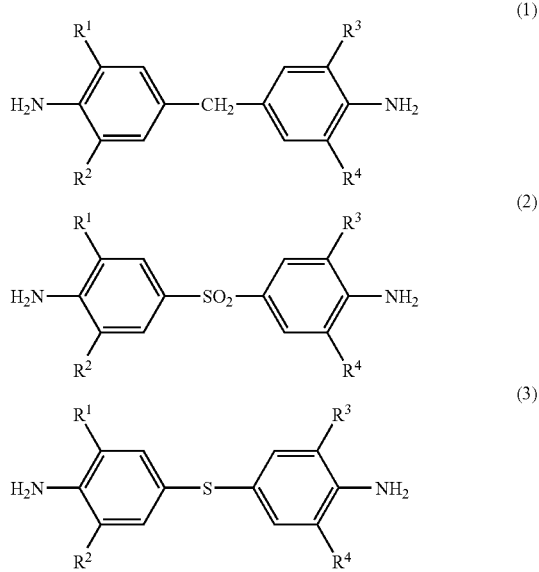

wherein each of $R^1$ to $R^4$ is hydrogen or a monovalent hydrocarbon group having 1 to 6 carbon atoms, the liquid epoxy resin (A) and the aromatic amine curing agent (B) being present in a molar ratio (A)/(B) from 0.7/1 to less than 0.9/1,
(C) 100 to 1,000 parts by weight of an inorganic filler, and
(D) an ester organic solvent having a boiling point of 130 to 250° C. and having the general formula (4):

$$R^5COO\text{—}[R^6\text{—}O]_n\text{—}R^7 \quad (4)$$

wherein $R^5$ and $R^7$ each are a monovalent hydrocarbon group having 1 to 6 carbon atoms, $R^6$ is an alkylene group having 1 to 6 carbon atoms, and n is an integer of 0 to 3 in an amount of 0.5 to 10 parts by weight per 100 parts by weight of components (A) and (B) combined, and the composition having a toughness $K_{1c}$ of at least 3.5.

2. The composition of claim 1, further comprising a silicone-modified resin in the form of a copolymer which is obtained from an alkenyl group-containing epoxy resin or phenolic resin and an organopolysiloxane having the average compositional formula (5):

$$H_aR^8_bSiO_{(4-a-b)/2} \quad (5)$$

wherein $R^8$ is a substituted or unsubstituted monovalent hydrocarbon group, "a" is a number of 0.01 to 0.1, "b" is a number of 1.8 to 2.2, and $1.81 \leq a+b \leq 2.3$ said organopolysiloxane containing per molecule 20 to 400 silicon atoms and 1 to 5 hydrogen atoms each directly attached to a silicon atom (i.e., SiH groups), by effecting addition of SiH groups to alkenyl groups.

3. The composition of claim 1 wherein the liquid epoxy resin is at least one selected from the group consisting of bisphenol epoxy resins, naphthalene epoxy resins, phenyl glycidyl ethers and an epoxy resin of the following structure:

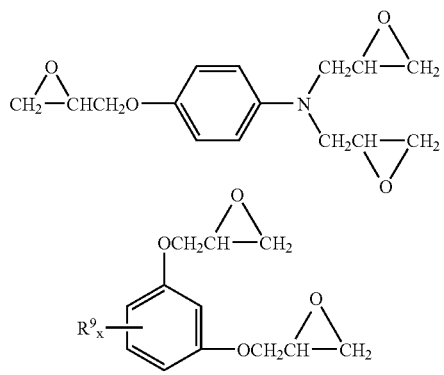

wherein $R^9_x$ is hydrogen or a monovalent hydrocarbon group having 1 to 20 carbon atoms, and x is an integer from 1 to 4.

* * * * *